United States Patent [19]

Chan et al.

[11] Patent Number: 5,570,405
[45] Date of Patent: Oct. 29, 1996

[54] REGISTRATION AND ALIGNMENT TECHNIQUE FOR X-RAY MASK FABRICATION

[75] Inventors: Ken Tze-Kin Chan, Wappingers Falls; William A. Enichen, Poughkeepsie; John G. Hartley, Fishkill, all of N.Y.; Maris A. Sturans, Essex Junction, Vt.

[73] Assignee: International Business Machines Corporation, Armonk, N.Y.

[21] Appl. No.: 466,564

[22] Filed: Jun. 6, 1995

[51] Int. Cl.⁶ .................................................. G21K 5/00
[52] U.S. Cl. ............................ 378/35; 378/34; 250/492.3
[58] Field of Search .................... 378/34, 35; 250/492.1, 250/492.2, 492.22, 492.3; 430/5

[56] References Cited

U.S. PATENT DOCUMENTS

| | | | |
|---|---|---|---|
| 3,742,229 | 6/1973 | Smith et al. | 378/34 |
| 3,742,230 | 6/1973 | Spears et al. | 250/65 |
| 4,152,601 | 5/1979 | Kadota et al. | 250/505 |
| 4,260,670 | 4/1981 | Burns | 430/5 |
| 4,370,554 | 1/1983 | Bohlen | 250/491.1 |
| 4,451,544 | 5/1984 | Kawabuchi | 430/5 |
| 4,785,187 | 11/1988 | Kariya et al. | 378/34 X |
| 5,262,257 | 11/1993 | Fukuda et al. | 430/5 |
| 5,459,001 | 10/1995 | Estes et al. | 378/35 X |

FOREIGN PATENT DOCUMENTS

| | | | |
|---|---|---|---|
| 2-45911 | 2/1990 | Japan . | |
| 4-212406 | 8/1992 | Japan . | |
| 4263416 | 9/1992 | Japan | 378/35 |

*Primary Examiner*—David P. Porta
*Attorney, Agent, or Firm*—DeLio & Peterson; Peter W. Peterson; Charles W. Peterson

[57] ABSTRACT

An X-ray mask includes one or more X-ray transparent mask windows and at least one pattern-to-mask alignment mark etched into the mask substrate from the same side as the mask windows. The pattern-to-mask alignment marks can be etched at the same time as the mask windows and are detectable from the front surface of the mask substrate by an electron beam lithography system prior to creating the circuit pattern. The alignment marks are detected by the absence of backscattered electrons at the pattern-to-mask alignment marks.

15 Claims, 3 Drawing Sheets

REGISTRATION AND ALIGNMENT TECHNIQUE FOR X-RAY MASK FABRICATION

BACKGROUND OF THE INVENTION

1. Field of the Invention

This invention relates genially to methods of manufacturing integrated circuits in which X-rays expose a wafer through a mask. More particularly, the invention relates to an exposure mask and a method of making the exposure mask in which alignment marks are etched into the exposure mask substrate to allow alignment of the circuit pattern relative to X-ray transparent windows on the mask.

2. Description of Related Art

Exposure masks are used in lithographic techniques during the manufacture of integrated circuits to define circuit features on a wafer. During construction of the mask, a pattern of the circuit features to be exposed onto the wafer is formed on the mask substrate. The pattern of circuit features is made of an absorptive or opaque material which blocks the beam used in the lithographic process. The beam in the lithographic system exposes a suitable sensitized film covering the wafer. When the wafer is exposed, the pattern on the mask is reproduced in the sensitized film. Subsequent processing, such as developing the sensitized film, etching, etc., in accordance with the particular lithographic technique being used reproduces the circuit pattern on the mask on the surface of the wafer to define the desired circuit elements.

In optical photolithographic fabrication techniques, the construction of the mask is accomplished by forming the circuit pattern at any convenient position on a blank mask substrate. In such systems the initial mask substrate is a featureless photographic film and there is no "alignment" necessary between the circuit pattern and the film. Regardless of where the circuit pattern is positioned on the film, it can be aligned with the previously constructed circuit elements on the wafer by moving the mask.

Usually, in addition to the circuit pattern on the mask substrate, one or more mask-to-wafer alignment marks are formed on the mask which have a known position relative to the circuit features in the pattern. The mask-to-wafer alignment marks are used to align the mask with corresponding marks on the wafer prior to the exposure process. Variations in where the circuit pattern is positioned relative to the edges of the mask substrate are compensated for during this mask-to-wafer alignment process.

The tendency of integrated circuits in semiconductor technology, however, is towards ever decreasing structure dimensions in order to increase the density of the circuits and their switching speed. Optical photolithography, which is still used today in the majority of cases, is approaching the limits dictated by the physical resolution of optical systems. Structures having conductive lines less than 0.25 µm in width cannot be made with optical systems. The most promising methods for the production of such fine structures are X-ray beam processes which employ X-ray masks.

Unlike the mask substrate in optical techniques, however, the X-ray mask substrate, upon which the circuit pattern is formed, is not featureless when the circuit pattern is formed on it. Generally, the X-ray mask substrate is a silicon substrate, thick enough to be opaque to X-rays, that has been etched from the back side in certain defined areas to produce mask windows that are X-ray transparent. The mask windows usually formed prior to placing the circuit pattern include a pattern window over which the circuit pattern must be located and one or more mask-to-wafer alignment mark windows to hold corresponding mask-to-wafer alignment marks. The circuit pattern is formed of an X-ray absorptive material, and must be positioned on the mask substrate within the perimeter of its mask windows to ensure that X-rays will pass through the mask substrate to create the corresponding circuit pattern on the wafer.

Accordingly, in the manufacture of X-ray exposure masks, there is an alignment step, not required in optical mask construction, of aligning the circuit pattern and the mask-to-wafer alignment marks relative to their corresponding mask windows on the mask substrate. If the circuit pattern is not positioned within its pattern window, the wafer may not be properly exposed with the entirety of the circuit pattern.

Generally, it would not be too difficult to ensure that the chip pattern is simply located within the confines of its pattern window, provided that the window is made large enough. However, one wants to keep the multiple chips on the wafer close together to improve yield, so increasing the window size is undesirable. Moreover, the circuit pattern on the mask is usually surrounded by a frame that is nearly the same size as the perimeter of the pattern window and which must accurately be positioned directly over the etched sidewalls of the pattern window.

When the mask windows are etched into the mask substrate, the etching process produces angled sidewalls relative to the back side of the substrate. If X-rays are permitted to reach the corners and angled surfaces at the edges of the pattern window, they may be scattered into the central chip exposure area below the circuit pattern on the wafer being manufactured. These X-rays would interfere with the circuit being constructed on the wafer. Accordingly, the frame of X-ray absorptive material referred to above is placed around the circuit pattern on the first or front surface of the mask substrate directly over the perimeter of the pattern window.

The frame cleanly defines the edge of the pattern window and prevents X-rays from scattering into the chip exposure area. This frame must be accurately positioned above the mask window side wall at the exact perimeter of the mask window. This makes accurate alignment of the pattern relative to the mask substrate very important.

In addition to the circuit pattern frame, a molybdenum mask is usually attached below the X-ray mask during exposure. The molybdenum mask has openings corresponding to the mask windows in the exposure mask. If the previously mentioned circuit frame on the front surface is accurately placed during X-ray mask fabrication, it relaxes the requirements on the molybdenum mask placement.

Similar alignment requirements during mask construction are found in connection with the mask-to-wafer alignment mark windows. Some X-ray masks are fabricated with an etched-through opening for the mask-to-wafer alignment mark windows. A polyamide film is placed across these windows to support the mask-to-wafer alignment marks. This allows optical transparency for these windows. If the area of a mask-to-wafer alignment mark window is large, the mask-to-wafer alignment mark on the polyamide film may shift relative to the surrounding silicon mask substrate. The smaller the window and the smaller the area of the unsupported polyamide film, the less the shift and the better alignment between mask and wafer that can be achieved. A small alignment mark window, however, increases the accuracy requirement for placing each mask-to-wafer alignment mark over its corresponding mask-to-wafer alignment mark window.

For all these reasons it is desirable to place the patterns of the exposure mask very accurately with respect to the mask windows in the substrate when the mask is made. Heretofore, there have been no good methods to achieve this first stage of alignment during construction of the mask.

Bearing in mind the problems and deficiencies of the prior art, it is therefore an object of the present invention to provide an X-ray mask exposure mask allowing easy alignment of circuit patterns and mask-to-wafer alignment marks relative to windows on the exposure mask.

It is another object of the present invention to provide an exposure mask with alignment marks at precise locations relative to windows on the exposure mask which can be located with an electron beam lithography system.

A further object of the invention is to provide an exposure mask that can be made easily by etching alignment marks at the same time and from the same side as mask windows are etched.

SUMMARY OF THE INVENTION

The above and other objects, which will be apparent to those skilled in the art, are achieved in the present invention which is directed to an X-ray mask having at least one pattern-to-mask alignment mark etched into the mask substrate from the same side as a pattern window. The mask substrate has a front or first surface that has the circuit pattern and mask-to-wafer alignment marks formed on it. The back or second surface has one or more mask windows formed on it and the mask-to-wafer alignment marks. The mask windows may include the pattern window through which the circuit pattern is exposed and the mask-to-wafer alignment mark windows through which alignment of the exposure mask with the chip wafer being manufactured is achieved.

Although the pattern-to-mask alignment mark is formed on the second surface, in the X-ray mask according to the preferred embodiment of the invention it is detectable from the first surface of the mask substrate by the electron beam of an electron beam lithography system. The electron beam of the electron beam lithography system is used to scan for the location of the pattern-to-mask alignment marks, and having identified those can then proceed to create the circuit pattern in the correct location on the first surface of the mask substrate.

In the most highly preferred embodiment of the invention the pattern-to-mask alignment mark is an etched cross forming approximately V-shaped valleys in the second surface whose depth is just less than the thickness of the mask substrate. The marks are detectable from the first surface of the mask substrate by the absence of backscattered electrons from the pattern-to-mask alignment mark because the electron beam penetrates through the thin remaining portion of the mask substrate and out the valley in the second surface instead of being backscattered as occurs in the thicker regions of the mask substrate.

An X-ray mask according to this invention will generally include at least two pattern-to-mask alignment marks located at relatively widely spaced locations on the mask substrate to permit both translational and rotational alignment of the pattern to be written on the mask with the windows already etched into the mask substrate.

A complete X-ray mask according to the invention may include a mask substrate, multiple plating base layers on the first surface of the mask substrate, one or more pattern windows and mask-to-wafer alignment mark windows etched into the second surface, a circuit pattern on the first surface of the mask substrate formed of an X-ray absorptive material, one or more mask-to-wafer alignment marks located on the first surface of the mask substrate above corresponding mask-to-wafer alignment mark windows, a frame on the first surface of the mask substrate formed around the pattern window, and a molybdenum mask below the second surface.

The invention further includes the method of making the X-ray mask. In the preferred method, the pattern-to-mask alignment marks are etched into the mask substrate from the second surface at the same time the pattern window and mask-to-wafer alignment mark windows are etched, thereby simplifying manufacturing, reducing cost and speeding construction. A further advantage of the method is that the detection of the pattern-to-mask alignment marks is done by the same tool creating the pattern on the mask via the scanning electron beam return signal of backscattered electrons

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

In describing the preferred embodiment of the present invention, reference will be made herein to FIGS. 1–7 of the drawings in which like numerals refer to like features of the invention.

Figure 1:
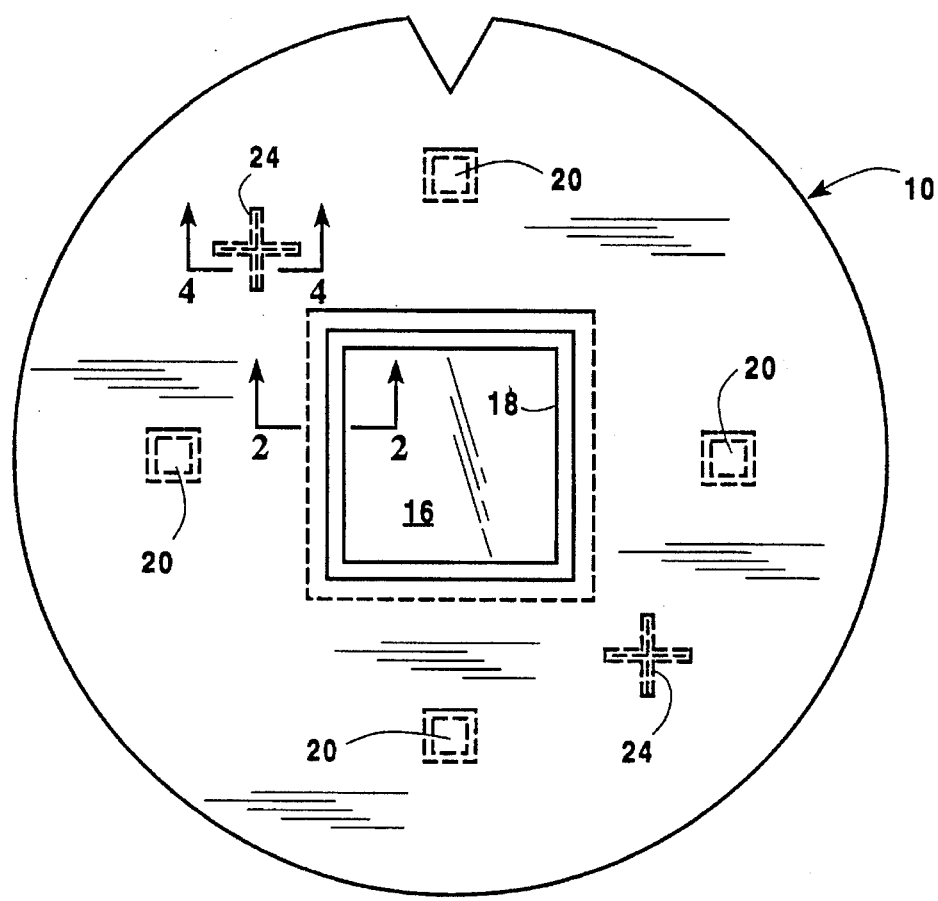
FIG. 1 is a top plan view of an exposure mask according to the present invention.
Figure 2:
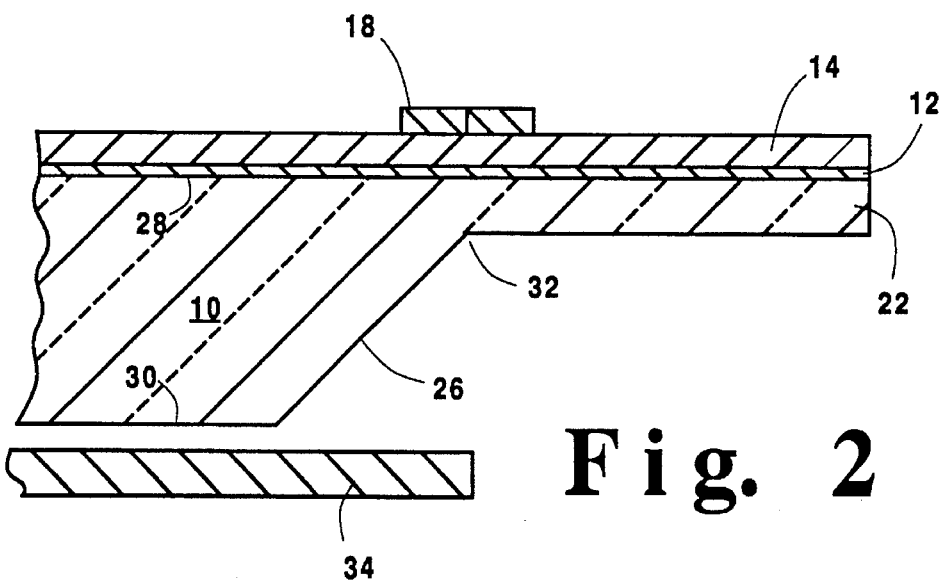
FIG. 2 is a cross sectional view along the line 2—2 in FIG. 1 showing the angled sidewall of the pattern window etched into the mask substrate.

Referring to FIGS. 1 and 2, the exposure mask includes a mask substrate 10 which is optionally covered by a two layer plating base composed of a first layer 12 of chromium having a thickness of approximately 50 Angstroms (5 nanometers) and second layer 14 of gold having a thickness of 300 Angstroms (30 nanometers). Centrally located on the mask substrate 10 is an X-ray transparent pattern window 16 and surrounding the pattern window 16 is an a X-ray absorptive frame 18.

Four mask-to-wafer alignment mark windows 20 are positioned around the pattern window 16. They are used to hold alignment marks for aligning the mask relative to the wafer before the exposure is made. These windows may be completely etched through for optical transparency and covered with a polyamide film to hold the mask-to-wafer alignment marks.

As can be seen in FIG. 2, the pattern window 16 is constructed by etching away the silicon mask substrate 10 from the second side (back side) until the silicon becomes X-ray transparent in area 22. The plating base materials 12 and 14 are also X-ray transparent, although a slight reduction in the magnitude of the X-ray beam may occur as it passes through the plating base layers and the remaining silicon.

The four mask-to-wafer alignment mark windows 20 may also be constructed as is seen in the cross section of FIG. 2, or they may be completely etched through and covered by a polyamide film.

The mask substrate 10 also includes the two cross-shaped pattern-to-mask alignment marks 24 which are an important element of this invention and are described more fully below.

Referring to FIG. 2, the sidewall 26 of the mask window can be seen to form an angle of 52° degrees with the first and second surfaces 28, 30 of the substrate 10. This is the result of the anisotropic etching process which results in a larger opening on the side from which the etching is initiated as the etchant attacks the sidewall as well as the thinning second surface during the etching process. As can be seen in FIG. 2, the etching of the mask windows 16, 20 was begun from the second surface 30 of the mask substrate 10. As will be seen in connection with the description of the pattern to mask alignment marks 24, they were created at the same time as the mask windows and share this angular sidewall characteristic.

When the mask is used, X-rays that impact the corner 32 between the angled sidewall 26 and the pattern window area 22 may be scattered into the region below the circuit pattern window. To prevent this, the frame 18 is formed of an X-ray absorptive material and covers the corner 32 around the perimeter of pattern window 16. An X-ray opaque molybdenum mask 34 is also provided below the second surface 30 to limit the size of the exposure region.

Generally, a circuit pattern (not shown) is constructed of an X-ray absorptive material and is made at the same time as the frame 18 within its confines. Mask-to-wafer alignment marks (also not shown) are formed above the mask-to-wafer alignment mark windows 20.

Figure 3:
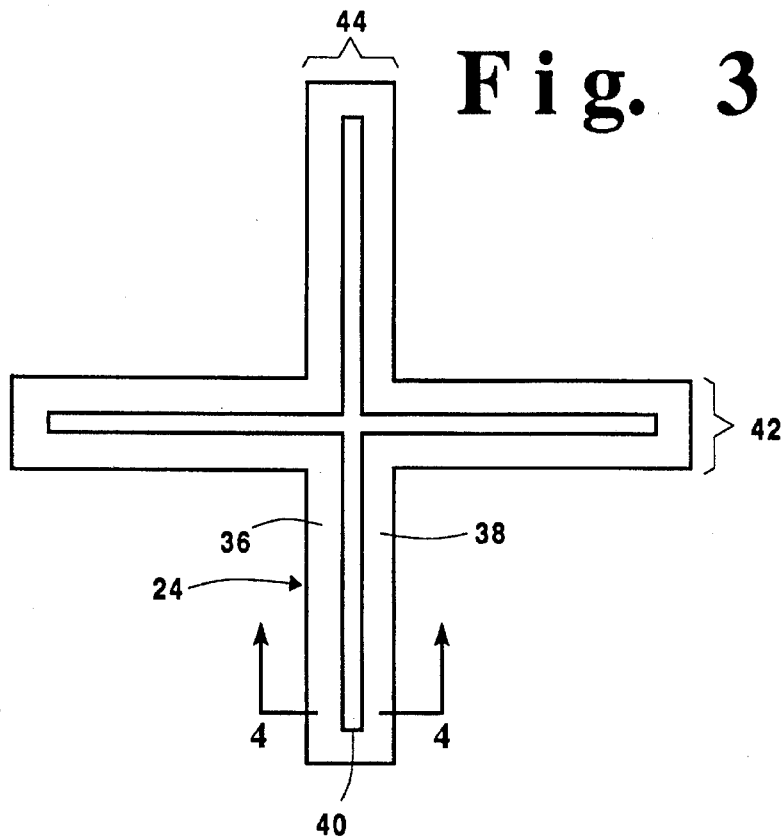
FIG. 3 is a bottom plan view, at an enlarged scale, of a portion of the exposure mask in FIG. 1, showing a single pattern-to-mask alignment mark in the mask substrate.
Figure 4:
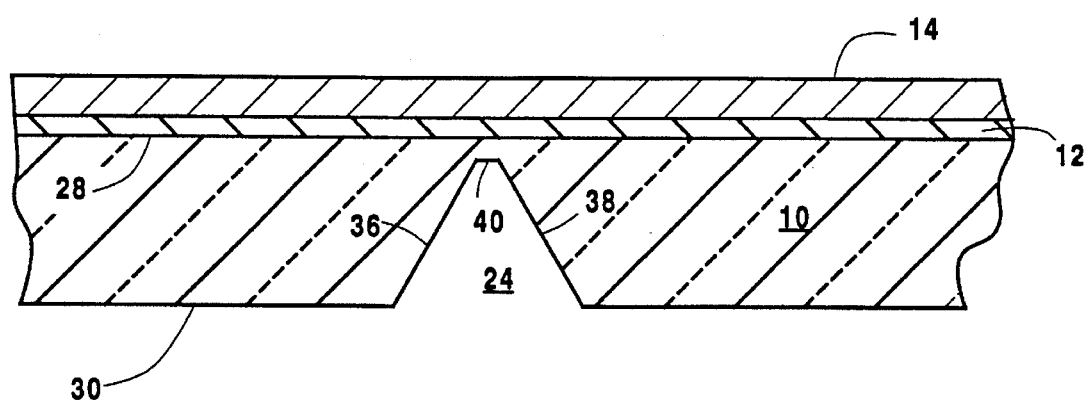
FIG. 4 is a cross sectional view of a pattern-to-mask alignment mark taken along the line 4—4 in the top plan view of FIG. 1. The same cross sectional line is also shown in the bottom plan view of FIG. 3.

FIG. 3 shows an expanded view of a pattern-to-mask alignment mark 24 as seen from the second surface 30. FIG. 4 is a cross-sectional view along the line 4—4 in FIG. 1 which also corresponds to the dotted cross-sectional line 4—4 in FIG. 3. FIG. 4 illustrates the angled side walls 36, 38 formed by the anisotropic etching process. The angled side walls 36, 38 produce an approximately V-shaped valley for the pattern-to-mask alignment mark which has a depth just slightly less than the thickness of the mask substrate 10. This produces a thin region 40 of silicon at the base of the valley close to the first surface 28.

The region 40 will pass electrons during scanning of the first surface by an electron beam lithography system, whereas the adjacent thicker silicon regions on either side of region 40 will backscatter the electrons signal. Thus, by monitoring the return signal, the absence of backscattered electrons indicates the presence of the alignment mark region 40.

Referring to FIG. 3, the alignment mark preferably consist of a horizontal alignment mark leg 42 and a vertical alignment mark leg 44 which form a cross shaped alignment mark. Other configurations for the alignment mark may also be used, for example alignment mark leg 42 can be placed at an entirely different, non-intersecting location than the alignment mark leg 44, or the point of intersection may be moved up or down or left or right. A T-shaped mark and other intersection points and shapes are equally suitable provided that defined locations on the mask substrate can be identified relative to the mask windows.

When the mask is constructed, the mask substrate 10 is initially etched from the second surface 30 to produce the desired mask windows 16, 20 and the pattern-to-mask alignment marks 24. Any conventional method of etching a silicon substrate may be used to form the etched mask windows and the pattern-to-mask alignment marks. Because the pattern-to-mask alignment marks are made at the same time as the desired mask windows 16, 20, their relative positions are maintained quite accurately.

The plating base layers 12 and 14 are added after etching. An electron beam sensitive layer is added next. The frame 18 and the circuit pattern (not shown) to be positioned above the pattern window 16 are preferably produced by an electron beam lithography system in the electron beam sensitive layer. The electron beam lithography system scans the surface of the mask to accurately determine the location of the pattern-to-mask alignment marks 24. It then produces the desired circuit pattern by writing the pattern into the electron beam sensitive layer.

Figure 5:
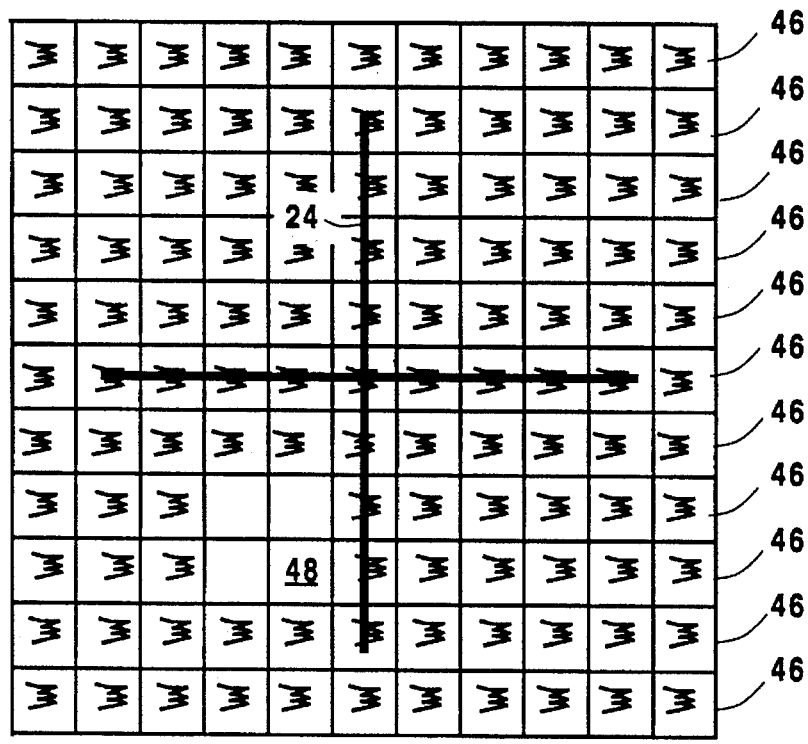
FIG. 5 is a top plan view of a typical deflection field over a portion of the exposure mask in FIG. 1, illustrating an array of subfields used in a search of the mask for a pattern-to-mask alignment mark.

The electron beam lithography system determines the location of the pattern-to-mask alignment marks 24 by scanning through a collection of electron beam scan subfields 46, 48 as shown in FIG. 5. Subfields in one column of the entire field that do not overlap the pattern-to-mask alignment mark 24 have been marked 46. Clearly, many other subfields exist that do not overlap the pattern-to-mask alignment mark 24. One subfield that does overlap the pattern-to-mask alignment mark 24 has been marked 48, and this subfield is shown in greater detail in FIG. 6.

Figure 6:
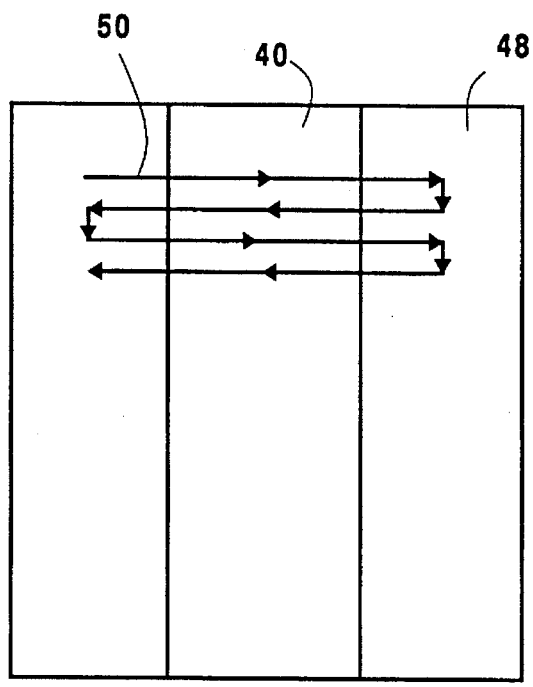
FIG. 6 is a top plan view of a single subfield from the array of subfields shown in FIG. 5, illustrating a scan over a portion of the pattern-to-mask alignment mark according to the present invention.
Figure 7:
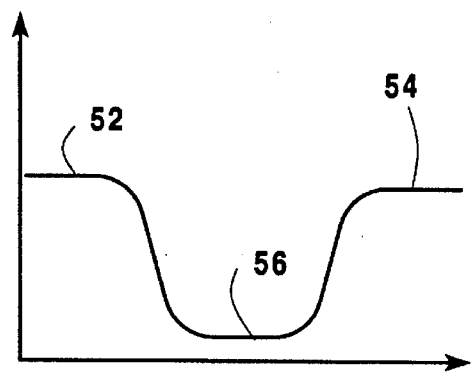
FIG. 7 is a graph of the return signal showing signal level on the vertical axis and position on the horizontal axis, resulting from a single scan line seen in FIG. 6 over the pattern-to-mask alignment mark.

Each subfield 46, 48 includes numerous scans of the electron beam as illustrated by scan lines 50 in FIG. 6. FIG. 7 illustrates the return signal detected in the electron beam lithography system during scan line 50 in FIG. 6 as it crosses the region 40. When the electron beam is scanning on either side of region 40, the return signal of backscattered electrons is high as indicated in regions 52, 54 in the graph of FIG. 7. However, as the electron beam enters region 40, the electrons stop being backscattered and begin to pass through the alignment mark, into the valley and out the second surface of the mask substrate. In this region 56 of FIG. 7, which corresponds to region 40 in the pattern-to-mask alignment mark, the return signal drops close to zero.

The return signal over the entire field of FIG. 5 is most preferably analyzed in a computer within the electron beam lithography system. The return signal is digitized allowing accurate identification of the exact location of the alignment mark. This location is then used in combination with the corresponding location of any additional alignment marks to determine the starting location for the electron beam to write the frame 18 and/or desired circuit pattern into the electron beam sensitive layer. Subsequent conventional processing of the electron beam sensitive layer produces the final X-ray absorptive circuit pattern and frame.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An X-ray mask comprising:

a mask substrate having first and second surfaces;

an X-ray transparent pattern window etched into the mask substrate from the second surface; and at least one pattern-to-mask alignment mark detectable from the first surface of the mask substrate and etched into the mask substrate from the second surface defining a fixed location relative to the pattern window suitable for aligning a circuit pattern relative to the pattern window, the at least one pattern-to-mask alignment mark comprising at least two valleys oriented at right angles to each other, the valleys being formed by etching into the second surface of the mask substrate, the valleys having a depth just less than the thickness of the mask substrate such that electrons impinging upon the pattern-to-mask alignment mark from the first surface of the mask substrate penetrate the mask substrate into the valleys to reduce the level of backscattered electrons from the first surface of the mask substrate.

2. An X-ray mask according to claim 1 further including at least one mask-to-wafer alignment mark window etched into the mask substrate from the second surface.

3. An X-ray mask according to claim 1 wherein the pattern-to-mask alignment mark is detectable from the first surface of the mask substrate by an absence of backscattered electrons from the pattern-to-mask alignment mark when an electron beam impinges the pattern-to-mask alignment mark from the first surface of the mask substrate.

4. An X-ray mask according to claim 1 wherein the pattern-to-mask alignment mark comprises a horizontal pattern-to-mask alignment mark portion and a vertical pattern-to-mask alignment mark portion.

5. An X-ray mask according to claim 1 wherein the X-ray mask includes at least two pattern-to-mask alignment marks located at spaced locations on the mask substrate.

6. An X-ray mask according to claim 1 further including a chip pattern formed of an X-ray absorptive material and located within the pattern window on the first surface of the mask substrate.

7. An X-ray mask according to claim 1 further including a frame formed of an X-ray absorptive material and located over a perimeter of the pattern window on the first surface of the mask substrate.

8. An X-ray mask according to claim 1 further including a mask-to-wafer alignment mark window and a mask-to-wafer alignment mark positioned over the mask-to-wafer alignment mark window.

9. A method of making an X-ray mask comprising:

providing a mask substrate of an X-ray absorptive material having first and second surfaces;

etching at least one mask-to-wafer alignment mark window into the mask substrate from the second surface;

etching a pattern window into the mask substrate from the second surface; and etching at least one pattern-to-mask alignment mark into the mask substrate from the second surface to define a fixed location relative to the pattern window detectable from the first surface of the mask substrate, the pattern-to-mask alignment mark being detectable from the first surface of the mask substrate by an absence of backscattered electrons from the pattern-to-mask alignment mark when an electron beam impinges the pattern-to-mask alignment mark from the first surface of the mask substrate, the pattern-to-mask alignment mark comprising at least two valleys oriented at right angles to each other, the valleys being formed by etching into the second surface of the mask substrate, the valleys having a depth just less than the thickness of the mask substrate such that electrons impinging upon the pattern-to-mask alignment mark from the first surface of the mask substrate penetrate the mask substrate into the valleys to reduce the level of backscattered electrons from the first surface of the mask substrate.

10. A method of making an X-ray mask according to claim 11 wherein the pattern-to-mask alignment mark comprises a horizontal pattern-to-mask alignment mark portion and a vertical pattern-to-mask alignment mark portion.

11. A method of making an X-ray mask according to claim 10 wherein the X-ray mask includes at least two pattern-to-mask alignment marks located at spaced locations on the mask substrate.

12. A method of making an X-ray mask according to claim 9 wherein the X-ray mask includes at least two pattern-to-mask alignment marks located at spaced locations on the mask substrate.

13. A method of making an X-ray mask according to claim 9 further including the step of forming a chip pattern within the pattern window on the first surface of the mask substrate of an X-ray absorptive material.

14. A method of making an X-ray mask according to claim 9 further including the step of forming a frame of an X-ray absorptive material over a perimeter of the pattern window on the first surface of the mask substrate.

15. A method of making an X-ray mask according to claim 9 further including the step of forming a mask-to-wafer alignment mark of an X-ray absorptive material over the mask-to-wafer alignment mark window.

* * * * *

UNITED STATES PATENT AND TRADEMARK OFFICE
CERTIFICATE OF CORRECTION

PATENT NO. : 5,570,405

DATED : October 29, 1996

INVENTOR(S) : Chan et al.

It is certified that error appears in the above-identified patent and that said Letters Patent is hereby corrected as shown below:

Column 1, Line 7: "genially" should read - - generally - - .

Signed and Sealed this

Twenty-eighth Day of January, 1997

Attest:

BRUCE LEHMAN

Attesting Officer     Commissioner of Patents and Trademarks